(12) United States Patent
Tachibana (10) Patent No.: US 6,586,995 B1
(45) Date of Patent: Jul. 1, 2003

(54) AMPLIFIER

(75) Inventor: Masanori Tachibana, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/246,444

(22) Filed: Sep. 19, 2002

(30) Foreign Application Priority Data

Apr. 3, 2002 (JP) ........................................ 2002-101807

(51) Int. Cl.[7] .................................................. H03F 3/45
(52) U.S. Cl. ........................................ 330/253; 330/257
(58) Field of Search ................................ 330/253, 257, 330/261

(56) References Cited

U.S. PATENT DOCUMENTS 5,504,782 A * 4/1996 Campbell, Jr. ............. 375/259
6,094,098 A * 7/2000 Vallancourt ................ 330/253
6,150,884 A * 11/2000 Fattaruso .................... 330/257
6,384,685 B1 * 5/2002 Juang ......................... 330/264

FOREIGN PATENT DOCUMENTS

| JP | 10-313587 | 11/1998 |
| JP | 11-122061 | 4/1999 |

* cited by examiner

*Primary Examiner*—Henry Choe
(74) *Attorney, Agent, or Firm*—Leydig, Voit & Mayer, Ltd.

(57) ABSTRACT

An amplifier includes a first voltage follower including P-type MOS transistors and a second voltage follower including N-type MOS transistors. The first voltage follower amplifies without being saturated even if an input signal voltage approaches a level of a power supply voltage when the input signal voltage is at least equal to a bias voltage, but does not amplify when the input voltage is less than the bias voltage. A second voltage follower of the amplifier amplifies without being saturated even if an input signal voltage approaches a ground potential when the input signal voltage is less than the bias voltage, but does not amplify when the input voltage is at least equal to the bias voltage.

7 Claims, 8 Drawing Sheets

FIG.8 PRIOR ART

AMPLIFIER

BACKGROUND OF THE INVENTION

1) Field of the Invention

The present invention relates to an amplifier used in semiconductor integrated circuits.

2) Description of the Related Art

Figure 8:
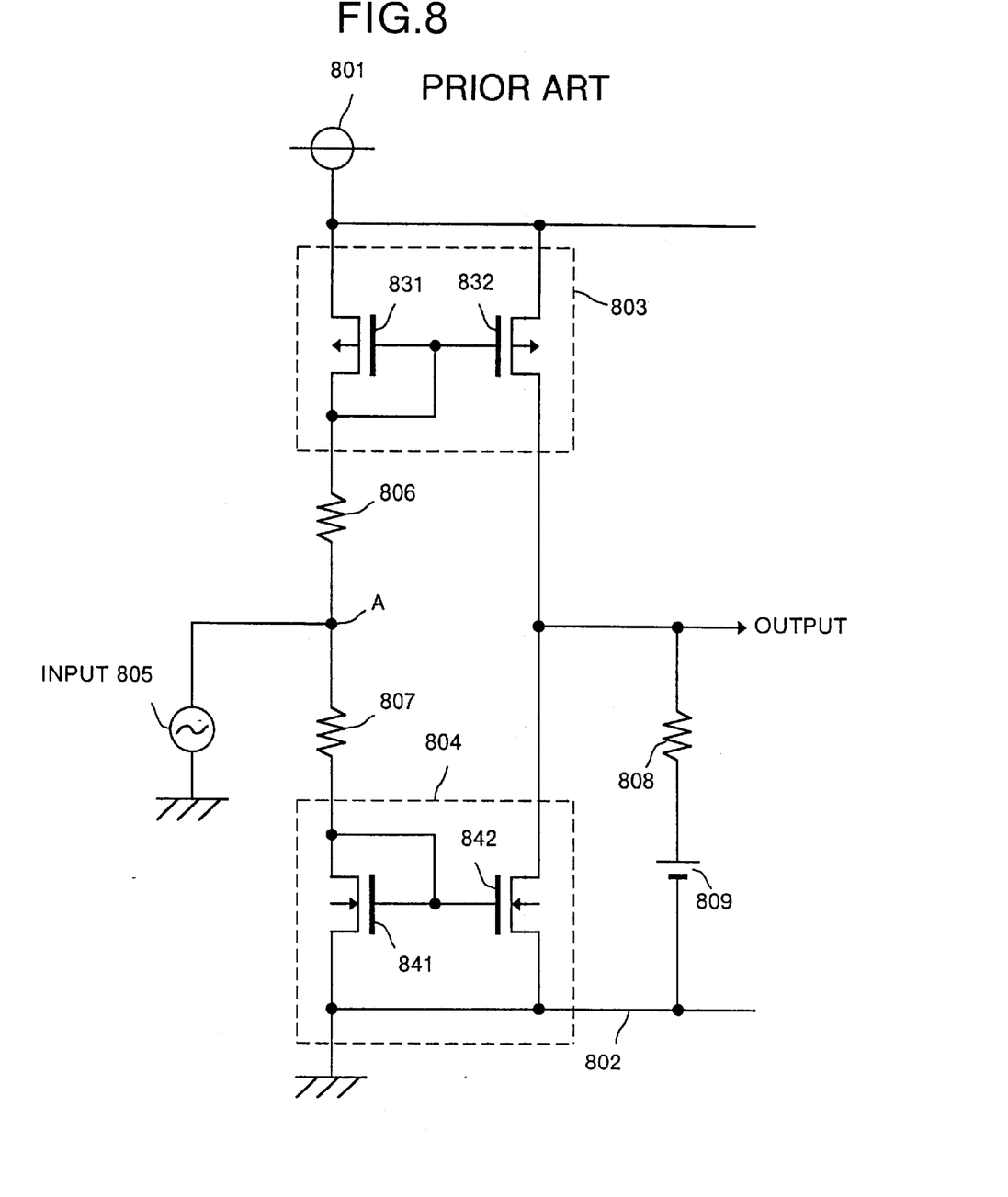
FIG. 8 is a circuit diagram that shows a configuration of an amplifier used in the conventional semiconductor integrated circuit.

FIG. 8 is a circuit diagram that shows a configuration example of an amplifier used in conventional semiconductor integrated circuits. The amplifier shown in FIG. 8 includes two current mirror circuits 803 and 804. The current mirror circuit 803 includes PMOS transistors 831 and 832. Source electrodes of the PMOS transistors 831 and 832 are connected to a power supply 801. The current mirror circuit 804 includes NMOS transistors 841 and 842. Source electrodes of the NMOS transistors 841 and 842 are connected to ground (GND) 802.

The diode-connected PMOS transistor 831 is connected at its drain electrode to a first terminal of a resistor 806. The diode-connected NMOS transistor 841 is connected at its drain electrode to a first terminal of a resistor 807. A second terminal of the resistor 806 and a second terminal of the resistor 807 are directly connected to form a node A. An input signal source 805 is connected to the node A and ground (GND).

Drain electrodes of the PMOS transistor 832 and the NMOS transistor 842 are directly connected to each other, and led to an output terminal, which is not shown. A series circuit consisting of a load resistor 808 and an output bias voltage source 809 is connected between a node of the drain electrodes of the PMOS transistor 832 and the NMOS transistor 842 and the ground (GND) 802.

The configuration is designed so as to cause the current mirror circuits 803 and 804 to provide the same current ratio. Resistors 806 and 807 are equal in resistance. Supposing that a voltage at the power supply 801 is Vcc, a voltage at the node A is Vcc/2. Therefore, the input signal source 805 has a voltage of Vcc/2 when there are no signals.

When the input signal source 805 has no signals, the two current mirror circuits 803 and 804 balance with each other and a current that flows out from the drain electrode of the PMOS transistor 832 becomes equal to a current that flows into the drain electrode of the NMOS transistor 842. At this time, a current does not flow through the load resistor 808. An output.voltage in this state is a voltage at the output bias voltage source 809.

If the voltage at the input signal source 805 becomes lower than the voltage at the node A, then the balance between the current mirror circuits 803 and 804 is lost. The current that flows out from the drain electrode of the PMOS transistor 832 becomes larger than the current that flows into the drain electrode of the NMOS transistor 842. A current that corresponds to the difference flows through the load resistor 808. Therefore, the output voltage rises above the voltage at the output bias voltage source 809.

On the contrary, also when the output voltage at the input signal source 805 becomes higher than the voltage at the node A, the balance between the current mirror circuits 803 and 804 is lost. In this instance, however, the current that flows out from the drain electrode of the PMOS transistor 832 becomes smaller than the current that flows into the drain electrode of the NMOS transistor 842. Therefore, a current flows from the output bias voltage source 809 into the NMOS transistor 842 through the load resistor 808. As a result, the output voltage falls below the voltage at the output bias voltage source 809.

In this way, the conventional amplifier is formed as an inverting amplifier, in which the output voltage changes in an opposite direction according to the input signal voltage.

With the advance of a finer pitch of the semiconductor integrated circuit design rule, the operation power supply voltage is becoming lower. A lower operation power supply voltage brings about an advantage that the power consumption is reduced. On the other hand, the lower operation power supply voltage brings about an evil influence that a wide dynamic range cannot be obtained especially in analog circuits. Therefore, it is desirable to use substantially the whole range between the ground potential and the power supply voltage as the operation range in an amplifier that operates with a low voltage.

In the conventional amplifier having the configuration, however, the voltage at the input signal source that is in the vicinity of the power supply voltage or the ground potential causes circuit saturation in the current mirror circuits 803 and 804, and obstructs normal operation of the current mirror circuits. Therefore, it is difficult to widen the dynamic range.

The gain of the amplifier is determined according to current values of the current mirror circuits 803 and 804, and also to the resistance of the load resistor 808. The current values of the current mirror circuits 803 and 804 are determined by resistances of the resistors 806 and 807, and gate-source voltages of the diode-connected PMOS transistor 831 and NMOS transistor 841. Therefore, there is also a problem that the gain is affected by dispersion factors.

SUMMARY OF THE INVENTION

It is an object of this invention to provide an amplifier suitable for low voltage operation, in which a dynamic range can be expanded to the whole range between the ground potential and the power supply voltage and the gain can be prevented from being affected by dispersion factors.

The amplifier according to one aspect of this invention includes a first voltage follower circuit that includes P-type MOS transistors and outputs a current having a magnitude equivalent to a value obtained by dividing a difference voltage between an input bias voltage applied to a positive-phase input terminal and an input signal voltage applied to a negative-phase input terminal supplied directly with a feedback from an output terminal via a first resistor, by resistance of the first resistor. The amplifier also includes a first current mirror circuit that takes out the output current of the first voltage follower circuit. The amplifier further includes a second voltage follower circuit that includes N-type MOS transistors and outputs a current having a magnitude equivalent to a value obtained by dividing a difference voltage between an input bias voltage applied to a positive-phase input terminal and the input signal voltage applied to a negative-phase input terminal supplied directly with a feedback from an output terminal via a second resistor, by resistance of the first resistor. The amplifier further includes a second current mirror circuit that takes out the output current of the second voltage follower circuit.

The amplifier according to another aspect of this invention includes a voltage follower circuit that includes P-type MOS transistors and outputs a current having a magnitude equivalent to a value obtained by dividing a difference voltage between an input bias voltage applied to a positive-phase input terminal and an input signal voltage applied to a negative-phase input terminal supplied directly with a feedback from an output terminal via a resistor, by resistance of the resistor, and a current mirror circuit that takes out the output current of the voltage follower circuit.

The amplifier according to still another aspect of this invention includes a voltage follower circuit that includes N-type MOS transistors and outputs a current having a magnitude equivalent to a value obtained by dividing a difference voltage between an input bias voltage applied to a positive-phase input terminal and an input signal voltage applied to a negative-phase input terminal supplied directly with a feedback from an output terminal via a resistor, by resistance of the resistor, and a current mirror circuit that takes out the output current of the voltage follower circuit.

Other objects and features of this invention will become apparent from the following description with reference to the accompanying drawings.

DETAILED DESCRIPTION

Embodiments of the amplifier according to the present invention will be explained in detail below with reference to the accompanying drawings.

Figure 1:
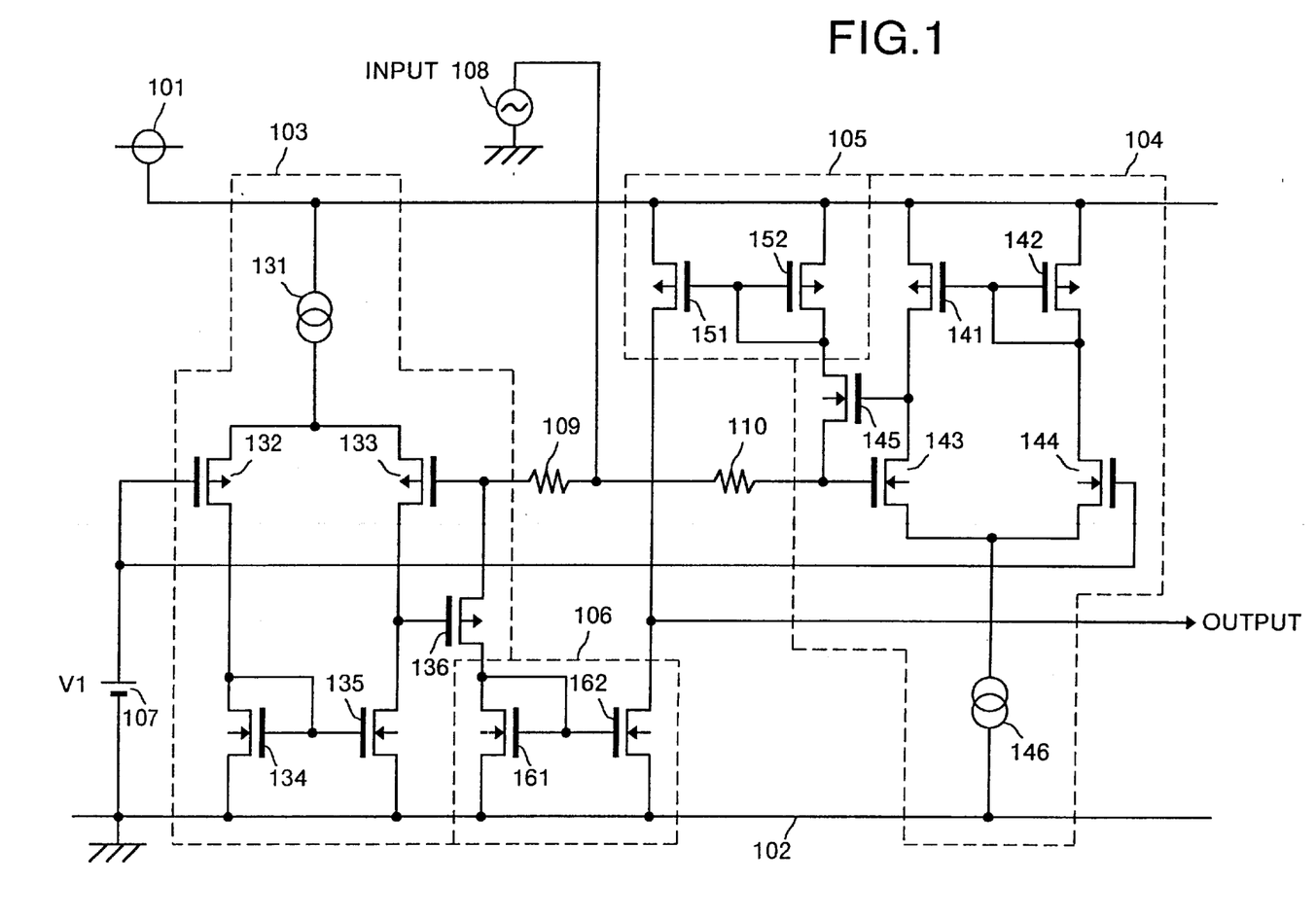
FIG. 1 is a circuit diagram that shows a configuration of a first embodiment of an amplifier according to the present invention.

A first embodiment of this invention will be explained below. FIG. 1 is a circuit diagram that shows the configuration of an amplifier as the first embodiment. As shown in FIG. 1, the amplifier includes two voltage follower circuits 103 and 104 and two current mirror circuits 105 and 106 provided between a power supply 101 and ground (GND) 102.

Among them, the voltage follower circuit 103 and the current mirror circuit 106 form one amplifier. The voltage follower circuit 104 and the current mirror circuit 105 form another amplifier. The two amplifiers share an input bias voltage source 107, an input signal source 108, and an output terminal, which is not shown.

The voltage follower circuit 103 includes a current source 131, PMOS transistors 132 and 133 which form an input circuit, NMOS transistors 134 and 135 which form a current mirror circuit that serves as a load circuit, and a PMOS transistor 136 which forms an output circuit.

Source electrodes of the PMOS transistors 132 and 133 are connected in common to the power supply 101 via the current source 131. The PMOS transistor 132 is connected at its gate electrode, which serves as a positive input terminal, to the input bias voltage source 107. The PMOS transistor 133 is connected at its gate electrode, which serves as a negative input terminal, to the input signal source 108 via a resistor 109. The gate electrode of the PMOS transistor 133 is connected to the PMOS transistor 136 at its source electrode.

The PMOS transistor 132 is connected at its drain electrode to the diode-connected NMOS transistor 134 at its drain electrode. The PMOS transistor 133 is connected at its drain electrode to the PMOS transistor 136 at its gate electrode and to the NMOS transistor 135 at its drain electrode. Source electrodes of the NMOS transistors 134 and 135 are connected in common to the ground (GND) 102. Gate electrodes of the NMOS transistors 134 and 135 are connected together.

The PMOS transistor 136 is connected at its drain electrode, which serves as an output terminal, to a diode-connected NMOS transistor 161 in the current mirror circuit 106 at its drain electrode. Source electrodes of the PMOS transistors 161 and 162 are connected in common to the ground (GND) 102. Gate electrodes of the NMOS transistors 161 and 162 are connected together. Drain electrodes of the NMOS transistor 162 and the PMOS transistor 151 in the current mirror circuit 105 are led to an output terminal, which is not shown.

The voltage follower circuit 104 includes NMOS transistors 143 and 144, which form an input circuit, PMOS transistors 141 and 142, which form a current mirror circuit that serves as a load circuit, and an NMOS transistor 145, which forms an output circuit, and a current source 146.

Source electrodes of the NMOS transistors 143 and 144 are connected in common to the ground (GND) 102 via the current source 146. The NMOS transistor 144 is connected at its gate electrode, which serves as a positive input terminal, to the input bias voltage source 107. The NMOS transistor 143 is connected at its gate electrode, which serves as a negative input terminal, to the input signal source 108 via a resistor 110. The gate electrode of the NMOS transistor 143 is connected to the NMOS transistor 145 at its source electrode.

The NMOS transistor 144 is connected at its drain electrode to the diode-connected PMOS transistor 142 at its drain electrode. The NMOS transistor 143 is connected at its drain electrode to the NMOS transistor 145 at its gate electrode and to the NMOS transistor 141 at its drain electrode. Source electrodes of the PMOS transistors 142 and 141 are connected in common to the power supply 101. Gate electrodes of the PMOS transistors 141 and 142 are connected together.

The NMOS transistor 145 is connected at its drain electrode, which serves as an output terminal, to a diode-connected PMOS transistor 152 in the current mirror circuit 105 at its drain electrode. Source electrodes of the PMOS transistors 151 and 152 are connect ed in common to the power supply 101. Gate electrodes of the PMOS transistors 151 and 152 are connected together. Drain electrodes of the PMOS transistor 151 and the NMOS transistor 162 in the current mirror circuit 106 are led to an output terminal, which is not shown, as explained above.

Operation of the first embodiment of an amplifier will now be explained with reference to FIG. 1. In the voltage follower circuit 103 shown in FIG. 1, a voltage at the gate of the PMOS transistor 133 becomes equal to an input bias voltage V1 at the input bias voltage source 107. The PMOS transistor 136 performs as a source follower circuit, and applies feedback to the gate electrode of the PMOS transistor 133. In the same way, in the voltage follower circuit 104, a voltage at the gate of the NMOS transistor 143 becomes equal to the input bias voltage V1 at the input bias Voltage source 107. The NMOS transistor 145 performs as a source follower circuit, and applies feedback to the gate electrode of the NMOS transistor 143.

If the signal voltage at the input signal source 108 is higher than the input bias voltage V1 at the input bias voltage source 107, then the PMOS transistor 136 in the voltage follower circuit 103 is in its on-state. Therefore, a current having a magnitude obtained by dividing a voltage difference between the signal voltage at the input signal source 108 and the input bias voltage V1 at the input bias voltage source 107 by resistance of the resistor 109 flows to the NMOS transistor 161 of the current mirror circuit 106 via the resistor 109 and the PMOS transistor 136. In the NMOS transistor 162, a current (mirror current) flows from its drain electrode toward its source electrode and the ground 102.

Even if the signal voltage at the input signal source 108 is raised to the level of the power supply voltage, the voltage follower circuit 103 operates normally without being saturated. The current that flows through the current mirror circuit 106 linearly changes according to the voltage difference between the input bias voltage V1 at the input bias voltage source 107 and the signal voltage at the input signal source 108. In the voltage follower circuit 104 at this time, the NMOS transistor 145 is in the off-state and consequently its output to the current mirror circuit 105 is cut off. Therefore, no current flows through the current mirror circuit 105.

On the contrary, if the signal voltage at the input signal source 108 is lower than the input bias voltage V1 at the input bias voltage source 107, then in the voltage follower circuit 103 the PMOS transistor 136 is in the off-state and cuts off its output. Therefore, no current flows through the current mirror circuit 106.

On the other hand, in the voltage follower circuit 104, the NMOS transistor 145 is in its on-state. Therefore, a current having a magnitude obtained by dividing a voltage difference between the signal voltage at the input signal source 108 and the input bias voltage V1 at the input bias voltage source 107 by resistance of the resistor 110, flows to the PMOS transistor 152 of the current mirror circuit 105 via the resistor 110 and the NMOS transistor 145. Through the PMOS transistor 151, a current (mirror current) flows from the power supply 101 toward its source electrode and drain electrode.

Even if the signal voltage at the input signal source 108 is lowered to the ground potential, the voltage follower circuit 104 operates normally without being saturated. The current that flows through the current mirror circuit 105 linearly changes according to the voltage difference between the input bias voltage V1 at the input bias voltage source 107 and the signal voltage at the input signal source 108.

According to whether the input signal voltage at the input signal source 108 is lower than the input bias voltage V1 at the input bias voltage source 107, the voltage follower circuit 103 or the voltage follower circuit 104 operates in a complementary manner, as heretofore explained.

According to the first embodiment, therefore, amplification can be conducted over substantially the whole range between the ground potential and the power supply voltage without causing saturation in the circuit. Therefore, an amplifier having a wide dynamic range can be implemented.

Figure 2:
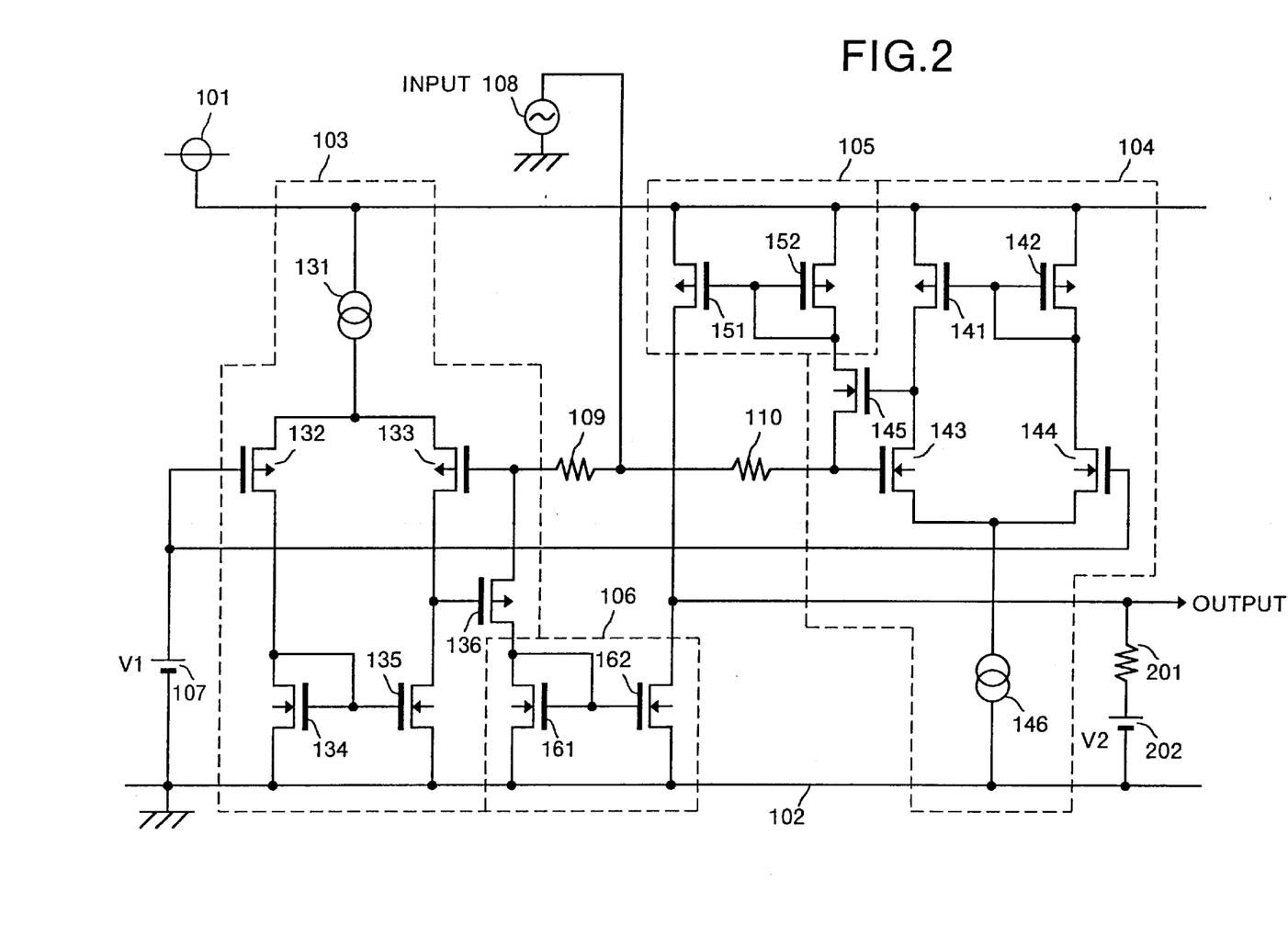
FIG. 2 is a circuit diagram that shows a configuration of a second embodiment of an amplifier according to the present invention.

A second embodiment of this invention will be explained below. FIG. 2 is a circuit diagram that shows the configuration of an amplifier as the second embodiment. In FIG. 2, components that are the same as or equivalent to those shown in the first embodiment (FIG. 1) are denoted by like characters. A section that concerns the second embodiment will now be explained mainly.

As shown in FIG. 2, the amplifier of the second embodiment differs from the configuration of the first embodiment (FIG. 1) in that a series circuit consisting of a load resistor 201 and an output bias voltage source 202 (having a voltage of V2) is connected between the output line of the current mirror circuits 105 and 106 and the ground (GND) 102 to provide a voltage output. Remaining portions have the same configuration as that of FIG. 1.

Figure 3:
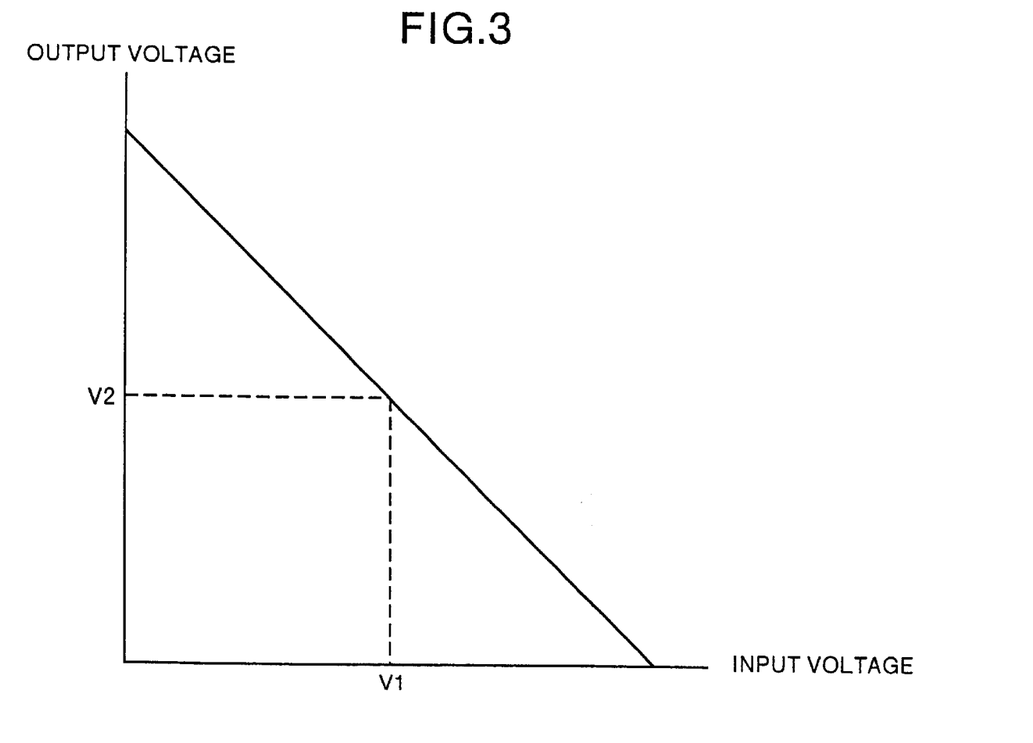
FIG. 3 is a characteristic diagram that shows an example of an input-output characteristic of the amplifier shown in FIG. 2.

Operation of the amplifier (voltage amplifier) according to the second embodiment will now be explained with reference to FIGS. 2 and 3. FIG. 3 is a characteristic diagram that shows an example of an input-output characteristic of the amplifier (voltage amplifier) shown in FIG. 2.

As explained with reference to the first embodiment, the voltage follower circuit 103 conducts amplification operation, when the signal voltage at the input signal source 108 is at least the input bias voltage V1 at the input bias voltage source 107. In this instance, a current flows from the load resistor 201 toward the current mirror circuit 106. In other words, the output voltage becomes a voltage obtained by subtracting a drop voltage across the load resistor 201 from the output bias voltage V2 of the output bias voltage source 202. As shown in FIG. 3, therefore, the output voltage has a characteristic that falls linearly with a predetermined slope from the output bias voltage V2 of the output bias voltage source 202.

On the other hand, the voltage follower circuit 104 conducts amplification operation, when the signal voltage at the input signal source 108 is less than the input bias. voltage V1 at the input bias voltage source 107. In this instance, a current is output from the current mirror circuit 105 toward the load resistor 201. In other words, the output voltage becomes a voltage obtained by adding the drop voltage across the load resistor 201 to the output bias voltage V2 of the output bias voltage source 202. As shown in FIG. 3, therefore, the output voltage has a characteristic that rises linearly with a predetermined slope from the output bias voltage V2 of the output bias voltage source 202.

The gain of the voltage amplifier is determined by only the ratio in resistance between the resistor 109 or 110 and the load resistor 201. Therefore, when this amplifier is implemented by using a semiconductor integrated circuit, the dispersion of the gain can be canceled.

According to the second embodiment, therefore, it is possible to obtain an amplifier in which the dynamic range is wide and the gain is affected little by dispersion factors when used as a voltage amplifier.

Figure 4:
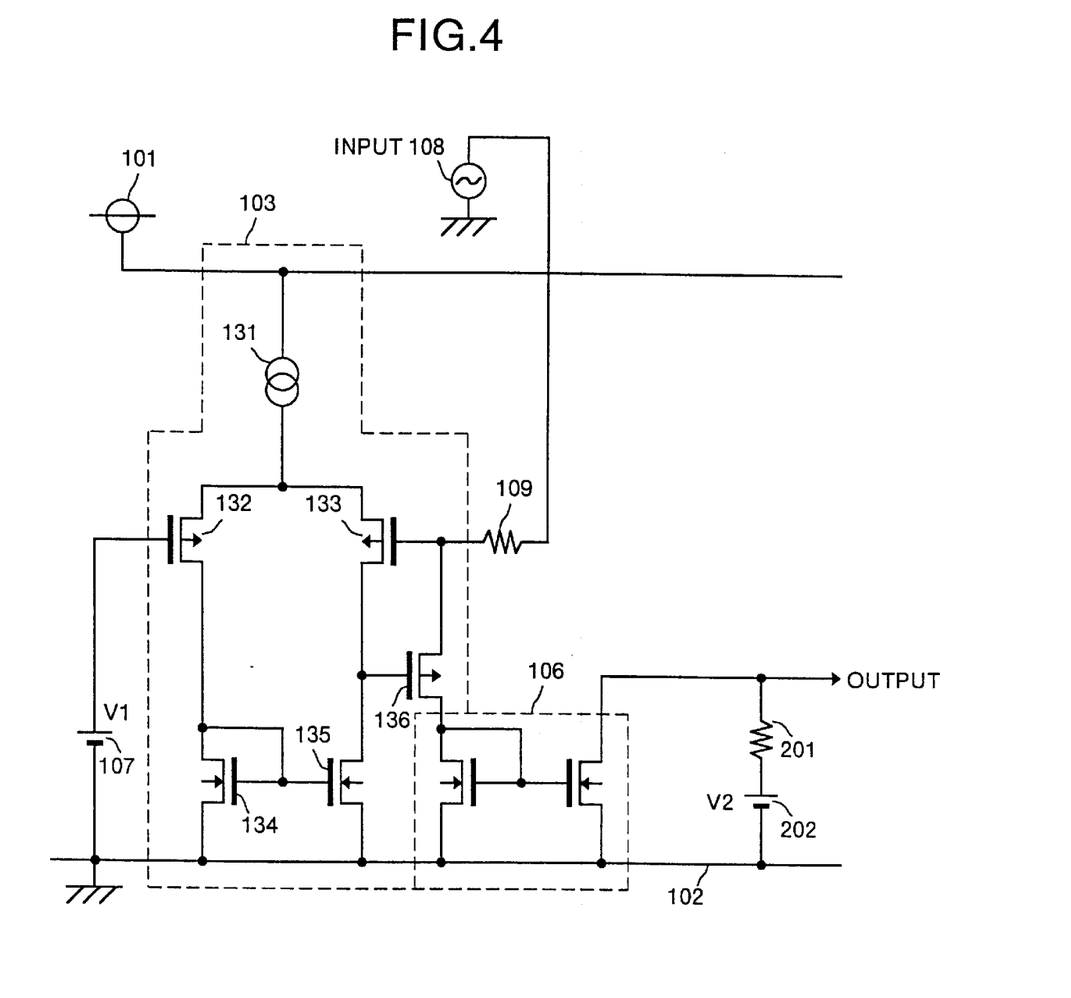
FIG. 4 is a circuit diagram that shows a configuration of a third embodiment of an amplifier according to the present invention.

A third embodiment of this invention will be explained below. FIG. 4 is a circuit diagram that shows the configuration of an amplifier as the third embodiment. In FIG. 4, components that are the same as or equivalent to those shown in the second embodiment (FIG. 2) are denoted by like characters. A section that concerns the third embodiment will now be explained mainly.

As shown in FIG. 4, the amplifier of the third embodiment differs from the configuration of the second embodiment (FIG. 2) in that the voltage follower circuit 104 and the current mirror circuit 105 are removed and the amplifier includes the voltage follower circuit 103, the current mirror circuit 106, and the series circuit consisting of the load resistor 201 and the output bias voltage source 202.

Figure 5:
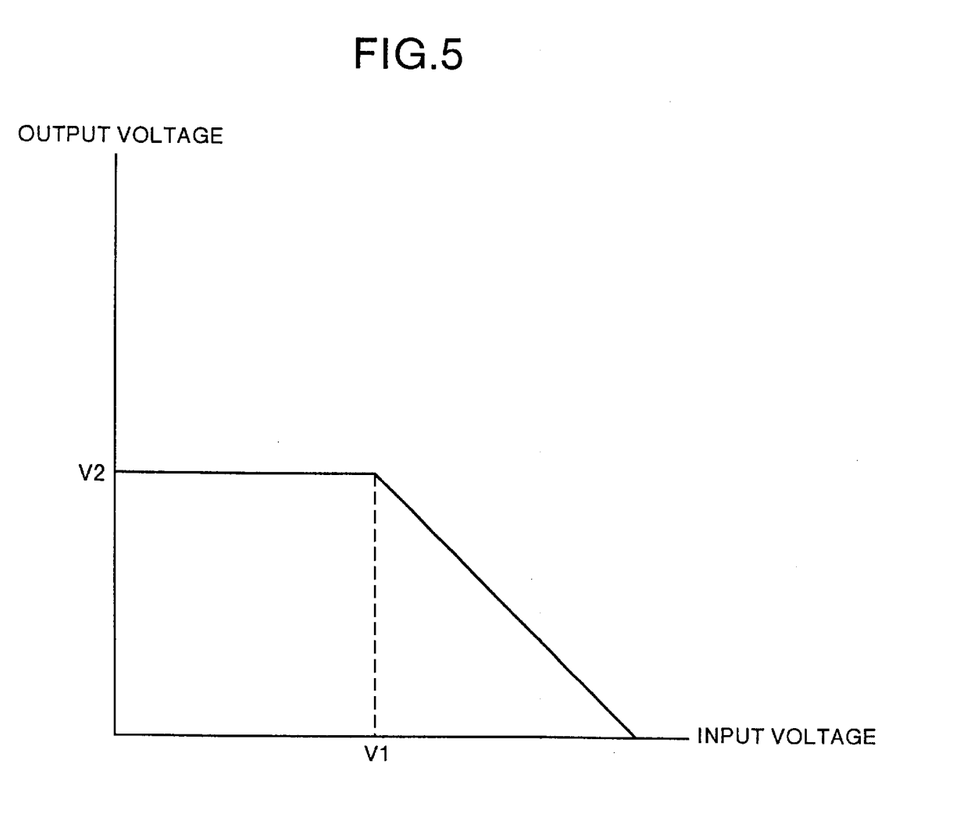
FIG. 5 is a characteristic diagram that shows an example of an input-output characteristic of the amplifier shown in FIG. 4.

Operation of the amplifier (voltage amplifier) according to the third embodiment will now be explained with reference to FIGS. 4 and 5. FIG. 5 is a characteristic diagram that shows an example of an input-output characteristic of the amplifier (voltage amplifier) shown in FIG. 4.

As explained with reference to the first embodiment, the voltage follower circuit 103 conducts amplification operation, when the signal voltage at the input signal source 108 is at least the input bias voltage V1 at the input bias voltage source 107. In this instance, a current flows from the load resistor 201 toward the current mirror circuit 106. Therefore, the output voltage becomes a voltage obtained by subtracting the drop voltage across the load resistor 201 from the output bias voltage V2 of the output bias voltage source 202.

On the other hand, when the signal voltage at the input signal source 108 is less than the input bias voltage V1 at the input bias voltage source 107, the voltage follower circuit 103 does not conduct amplification operation and no current flows through the current mirror circuit 106. In this instance, the output voltage becomes the output bias voltage V2 of the output bias voltage source 202.

As shown in FIG. 5, therefore, when the signal voltage at the input signal source 108 is at least the input bias voltage V1 at the input bias voltage source 107, the output voltage has a characteristic that falls linearly with a predetermined slope from the output bias voltage V2 of the output bias voltage source 202. When the signal voltage at the input signal source 108 is less than the input bias voltage V1 at the input bias voltage source 107, however, the output voltage has such a characteristic as to be clipped at the output bias voltage V2 of the output bias voltage source 202.

The gain of the voltage amplifier according to the third embodiment is determined by only the ratio in resistance between the resistor 109 and the load resistor. 201. Therefore, in the same way as the second embodiment, the gain is not affected by dispersion factors.

In the third embodiment, the example of application to the second embodiment has been shown. However, it is also possible to remove the voltage follower circuit 104 and the current mirror circuit 105 from the configuration shown in the first embodiment (FIG. 1) and obtain an amplifier having the voltage follower circuit 103 and the current mirror circuit 106.

Figure 6:
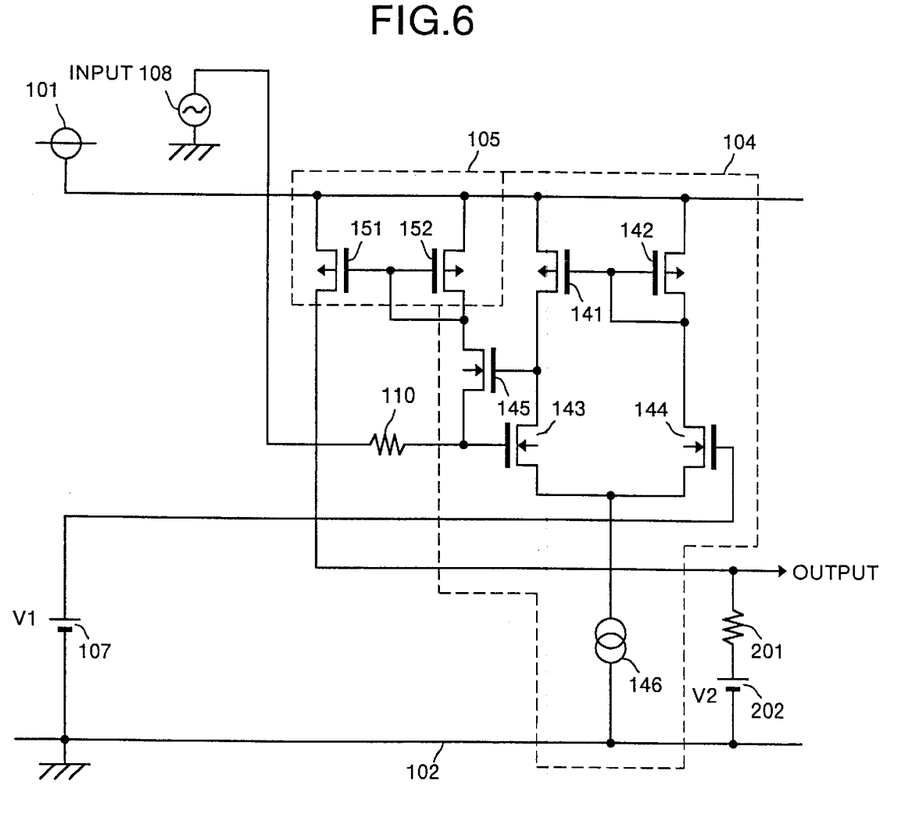
FIG. 6 is a circuit diagram that shows a configuration of a fourth embodiment of an amplifier according to the present invention.

A fourth embodiment of this invention will be explained below. FIG. 6 is a circuit diagram that shows the configuration of an amplifier as the fourth embodiment. In FIG. 6, components that are the same as or equivalent to those shown in the second embodiment (FIG. 2) are denoted by like characters. A section that concerns the fourth embodiment will now be explained mainly.

As shown in FIG. 6, the amplifier of the fourth embodiment differs from the configuration of the second embodiment (FIG. 2) in that the voltage follower circuit 103 and the current mirror circuit 106 are removed and the amplifier includes the voltage follower circuit 104, the current mirror circuit 105, and the series circuit consisting of the load resistor 201 and the output bias voltage source 202.

Figure 7:
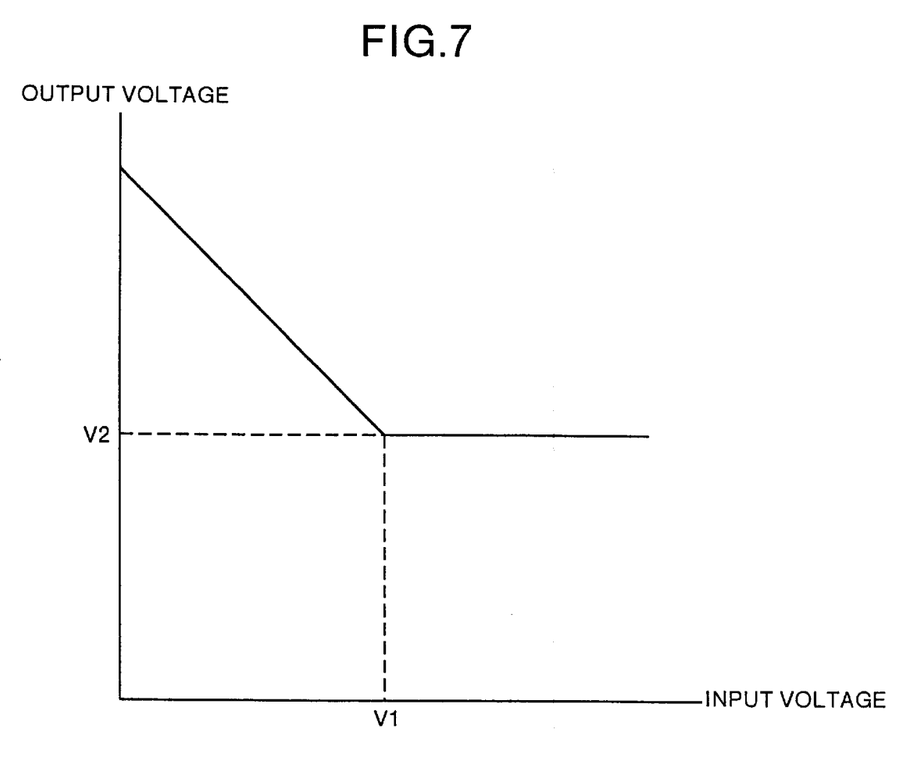
FIG. 7 is a characteristic diagram that shows an example of an input-output characteristic of the amplifier shown in FIG. 6.

Operation of the amplifier (voltage amplifier) according to the fourth embodiment will now be explained with reference to FIGS. 6 and 7. FIG. 7 is a characteristic diagram that shows an example of an input-output characteristic of the amplifier (voltage amplifier) shown in FIG. 6.

As explained with reference to the first embodiment, the voltage follower circuit 104 conducts amplification operation, when the signal voltage at the input signal source 108 is less than the input bias voltage V1 at the input bias voltage source 107. In this instance, a current is output from the current mirror circuit 105 toward the load resistor 201. Therefore, the output voltage becomes a voltage obtained by adding the drop voltage across the load resistor 201 to the output bias voltage V2 of the output bias voltage source 202.

On the other hand, when the signal voltage at the input signal source 108 is at least the input bias voltage V1 at the input bias voltage source 107, the voltage follower circuit 104 does not conduct amplification operation and no current flows through the current mirror circuit 105. In this instance, the output voltage becomes the output bias voltage V2 of the output bias voltage source 202.

As shown in FIG. 7, therefore, when the signal voltage at the input signal source 108 is less than the input bias voltage V1 at the input bias voltage source 107, the output voltage has a characteristic that rises linearly with a predetermined slope from the output bias voltage V2 of the output bias voltage source 202. However, when the signal voltage at the input signal source 108 is at least the input bias voltage V1 at the input bias voltage source 107, the output voltage has such a characteristic as to be clipped at the output bias voltage V2 of the output bias voltage source 202.

The gain of the voltage amplifier according to the fourth embodiment is determined by only the ratio in resistance between the resistor 110 and the load resistor 201. In the same way as the second and third embodiments, therefore, the gain is not affected by dispersion factors.

In the fourth embodiment, the example of application to the second embodiment has been shown. However, it is also possible to remove the voltage follower circuit 103 and the current mirror circuit 106 from the configuration shown in the first embodiment (FIG. 1) and obtain an amplifier having the voltage follower circuit 104 and the current mirror circuit 105.

As described above, according to one aspect of this invention, when an input signal voltage is at least an input bias voltage, the first voltage follower circuit including P-type MOS transistors conducts amplification operation without being saturated even if the input signal voltage approaches a level of a power supply voltage, and a current having a magnitude equivalent to a value obtained by dividing a difference voltage between the input bias voltage and the input signal voltage by resistance of the first resistor is flown and output from the first current mirror circuit. When the input signal voltage is less than the input bias voltage, however, the first voltage follower circuit does not conduct the amplification operation. On the other hand, when an input signal voltage is less than a bias voltage, the second voltage follower circuit including N-type MOS transistors conducts amplification operation without being saturated even if the input signal voltage approaches a level of the ground potential, and a current having a magnitude equivalent to a value obtained by dividing a difference voltage between the input bias voltage and the input signal voltage by resistance of the second resistor is flown and output from the second current mirror circuit. However, when the input signal voltage is at least the bias voltage, the second voltage follower circuit does not conduct the amplification operation. The first and second voltage followers thus operate in a complementary manner. Amplification operation can be conducted over substantially the whole range between the ground potential and the power supply voltage without causing saturation. Therefore, the amplifier having a wide dynamic range can be implemented. In this way, the amplifier suitable for low voltage operation is obtained.

Moreover, the series circuit consists of the load resistor and the output bias voltage source. This series circuit is connected between the ground and the output line common to the first current mirror circuit and the second current mirror circuit. As a result, a voltage output is obtained. Since the gain is determined by only the ratio in resistance between the first or second resistor and the load resistor, gain dispersion can be canceled when the amplifier is formed of a semiconductor integrated circuit. In other words, it is possible to obtain the voltage amplifier in which the dynamic range is wide and the gain is affected little by dispersion factors.

According to another aspect of this invention, when an input signal voltage is at least an input bias voltage, the voltage follower circuit including P-type MOS transistors conducts amplification operation without being saturated even if the input signal voltage approaches a level of a power supply voltage, and a current having a magnitude equivalent to a value obtained by dividing a difference voltage between the input bias voltage and the input signal voltage by resistance of the resistor, is flown and output from the current mirror circuit. However, when the input signal voltage is less than the input bias voltage, the voltage follower circuit does not conduct the amplification operation. Therefore, if the voltage follower circuit includes P-type MOS transistors, the dynamic range can be expanded to substantially the whole range between the input bias and the level of the voltage power supply. When an input signal voltage is less than an input bias voltage, the voltage follower circuit including N-type MOS transistors conducts amplification operation without being saturated even if the input signal voltage approaches a level of the ground potential, and a current having a magnitude equivalent to a value obtained by dividing a difference voltage between the input bias voltage and the input signal voltage by resistance of the resistor is flown and output from the current mirror circuit. However, when the input signal voltage is at least the input bias voltage, the voltage follower circuit does not conduct the amplification operation. Therefore, if the voltage follower circuit includes N-type MOS transistors, the dynamic range can be expanded to substantially the whole range between the input bias voltage and the level of the ground potential.

Furthermore, the series circuit consists of the load resistor and the output bias voltage source. This series circuit is connected between the ground and the output line of the current mirror circuit. As a result, a voltage output such that its portion above or below the level of the output bias voltage at the output bias voltage source is clipped is obtained. Since the gain is determined by only the ratio in resistance between the resistor and the load resistor, gain dispersion can be canceled when the amplifier is formed of a semiconductor integrated circuit. It is therefore possible to obtain the amplifier in which the gain is affected little by dispersion.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An amplifier comprising:
   a first voltage follower circuit that includes a plurality of P-type MOS transistors and outputs a current having a magnitude equivalent to a value obtained by dividing a difference voltage between an input bias voltage, applied to a positive-phase input terminal of the first voltage follower circuit, and an input signal voltage, applied to a negative-phase input terminal of the first voltage follower circuit, supplied directly with feedback from an output terminal via a first resistor, by resistance of the first resistor;
   a first current mirror circuit that receives the current output by the first voltage follower circuit;
   a second voltage follower circuit that includes a plurality of N-type MOS transistors and outputs a current having a magnitude equivalent to a value obtained by dividing a difference voltage between an input bias voltage applied to a positive-phase input terminal of the second voltage follower circuit, and the input signal voltage, applied to a negative-phase input terminal of the second voltage follower circuit, supplied directly with feedback from an output terminal, via a second resistor, by resistance of the second resistor; and
   a second current mirror circuit that receives the current output by the second voltage follower circuit.

2. The amplifier according to claim 1, further comprising a series circuit connected between ground and an output line common to the first current mirror circuit and the second current mirror circuit, wherein the series circuit includes a load resistor and an output bias voltage source.

3. The amplifier according to claim 2, wherein gain of the amplifier is determined only by a ratio of the resistances of the first and second resistors and resistance of the load resistor.

4. An amplifier comprising:
   a voltage follower circuit that includes P-type MOS transistors and outputs a current having a magnitude equivalent to a value obtained by dividing a difference voltage between an input bias voltage, applied to a positive-phase input terminal, and an input signal voltage applied to a negative-phase input terminal, supplied directly with a feedback from an output terminal, via a resistor, by resistance of the resistor;
   a current mirror circuit that receives the current output by the voltage follower circuit; and
   a series circuit connected between ground and an output line of the current mirror circuit, wherein the series circuit includes a load resistor and an output bias voltage source.

5. The amplifier according to claim 4, wherein gain of the amplifier is determined only by a ratio of the resistance of the resistor and resistance of the load resistor.

6. An amplifier comprising:
   a voltage follower circuit that includes N-type MOS transistors and outputs a current having a magnitude equivalent to a value obtained by dividing a difference voltage between an input bias voltage, applied to a positive-phase input terminal, and an input signal voltage applied to a negative-phase input terminal, supplied directly with feedback from an output terminal, via a resistor, by resistance of the resistor;
   a current mirror circuit that receives the current output by the voltage follower circuit; and
   a series circuit connected between ground and an output line of the current mirror circuit, wherein the series circuit includes a load resistor and an output bias voltage source.

7. The amplifier according to claim 6, wherein gain of the amplifier is determined only by a ratio of the resistance of the resistor and resistance of the load resistor.

* * * * *